(12) United States Patent
Levy et al.

(10) Patent No.: US 7,034,576 B2
(45) Date of Patent: Apr. 25, 2006

(54) PULSED DYNAMIC KEEPER GATING

(75) Inventors: Howard Levy, Cedar Park, TX (US);
Nadeem Eleyan, Austin, TX (US);
Harsh Sharma, Austin, TX (US);
Hong Kim, Austin, TX (US)

(73) Assignee: Sun Microsystems, Inc., Santa Clara, CA (US)

( * ) Notice: Subject to any disclaimer, the term of this patent is extended or adjusted under 35 U.S.C. 154(b) by 0 days.

(21) Appl. No.: 10/607,949

(22) Filed: Jun. 27, 2003

(65) Prior Publication Data

US 2004/0263208 A1 Dec. 30, 2004

Related U.S. Application Data

(60) Provisional application No. 60/479,691, filed on Jun. 19, 2003.

(51) Int. Cl.
*H03K 19/096* (2006.01)

(52) U.S. Cl. ........................... 326/98; 326/95

(58) Field of Classification Search ............... 326/93, 326/95, 98; 327/208–212, 214, 215, 224, 327/225
See application file for complete search history.

(56) References Cited

U.S. PATENT DOCUMENTS

| | | | |
|---|---|---|---|
| 6,002,292 A * | 12/1999 | Allen et al. | 327/379 |
| 6,204,714 B1 * | 3/2001 | Milshtein et al. | 327/299 |
| 6,366,132 B1 * | 4/2002 | Karnik et al. | 326/121 |
| 6,404,235 B1 * | 6/2002 | Nowka et al. | 326/96 |
| 6,542,006 B1 * | 4/2003 | Sprague et al. | 326/95 |
| 6,707,318 B1 * | 3/2004 | Kumar et al. | 326/98 |
| 6,714,059 B1 * | 3/2004 | Choe | 327/200 |
| 6,794,901 B1 * | 9/2004 | Bernstein et al. | 326/95 |
| 2004/0008056 A1 * | 1/2004 | Kursun et al. | 326/96 |

OTHER PUBLICATIONS

Neil H. E. Weste and Kamran Eshraghian, Principles of CMOS VLSI Design, A Systems Perspective, Second Edition, Addison-Wesley Publishing Co., Copyright 1993 by AT&T, pp. 298-303, no month.

* cited by examiner

*Primary Examiner*—Vibol Tan
(74) *Attorney, Agent, or Firm*—Zagorin O'Brien Graham LLP

(57) ABSTRACT

A circuit has been developed that reduces the effective strength of a keeper circuit during an interval in which at least one path of an evaluation circuit is sensitive to a keeper device. The keeper circuit includes a keeper gating device coupled to a keeper device that is responsive to a keeper control. The keeper device is sized to overcome leakage current in the evaluation circuit. In some configurations, the keeper circuit includes a weak keeper device that is minimally sized to overcome noise while the keeper device is effectively disabled. In some configurations, the reduction in effective strength of the keeper circuit occurs before arrival of the fastest signal coupled to a sensitive output path of the evaluation circuit and the effective strength is restored after arrival of the slowest signal coupled to the sensitive output path of the evaluation circuit.

28 Claims, 4 Drawing Sheets

PULSED DYNAMIC KEEPER GATING

CROSS-REFERENCE TO RELATED APPLICATION(S)

This application claims the benefit under 35 U.S.C. § 119(e) of U.S. Provisional Application No. 60/479,691, filed Jun. 19, 2003.

BACKGROUND

1. Field of the Invention

This invention relates to dynamic circuits and more particularly to keeper devices utilized in dynamic circuits.

2. Description of the Related Art

Dynamic Complementary Metal Oxide Semiconductor (CMOS) circuits precharge a node and conditionally discharge the node based on inputs evaluated by the circuit. Referring to FIG. 1, a prior art OR circuit 100 is illustrated with a p-channel precharge device 102 and n-channel evaluation logic. The n-channel evaluation logic includes devices 104–108 and an n-channel ground switch 110. Devices 102 and 110 are enabled during opposite phases of the signal CLOCK, disabling at least one transistor in the path between $V_{DD}$ and $V_{SS}$ at a given time. Therefore, a DC current path does not exist from $V_{DD}$ to $V_{SS}$ and the steady-state current is zero. However, a static leakage current exists due to reverse bias leakage between diffusion regions and the substrate in the n-channel devices 104–110. This leakage current may sufficiently discharge dynamic node 116 to produce an incorrect value at the output node, OUT.

The effects of this leakage current may be countered by introducing keeper 112 at dynamic node 116. Keeper 112 latches the output of the circuit. Alternatively, keeper 112 could be statically configured by grounding the gate input. Keeper 112 is a weak keeper, that is, a p-transistor designed to have a low gain achieved by a small W/L ratio so that the gain is low enough to be overcome by pull-down transistors 104–110. However, keeper 112 has a large enough gain to offset the effects of the leakage current. In circuits with a large number of inputs, each input requiring a pull-down transistor coupled to a single dynamic node, the leakage current may be too large for a weak keeper to counteract. Replacing the weak keeper of keeper 112 with a strong keeper (i.e., a device that has a high gain achieved by a large W/L ratio), slows down circuit transitions due to the additional capacitance of the stronger keeper transistor. In addition, pull-down devices may be unable overcome the strong keeper transistor and the dynamic node may not switch properly, resulting in the circuit producing incorrect output values at the output node. Instead, prior art circuits typically maintain proper functionality and high speed by limiting the number of pull-down transistors used with a weak keeper. The limit on the number of pull-down transistors may limit the number of inputs the dynamic circuit can evaluate. For example, in FIG. 1, circuit 100 is limited to k input pull-down devices. As a result, circuit designs using these dynamic circuits may implement more complex circuitry to achieve the same functionality as a device having a greater number of input pull-down devices. Increasing circuit complexity may decrease speed, increase circuit size, and increase manufacturing costs.

Therefore, it would be desirable to use a strong keeper to overcome leakage of the evaluation devices of a large number of inputs, without compromising the functionality or speed of the circuit.

SUMMARY

Accordingly, it has been discovered that a keeper circuit for a dynamic node of a circuit may be designed or configured such that the effective strength of the keeper circuit operating on the dynamic node may be reduced during an interval in which at least one path of an evaluation circuit is sensitive to a strong keeper device. This sensitivity may otherwise produce incorrect functionality and/or reduced speed of a circuit with a keeper device.

In one embodiment in accordance with the present invention, a circuit includes a dynamic node, an evaluation circuit, and a keeper circuit coupled to the dynamic node. The circuit may include a precharge device. The precharge device and the evaluation circuit may operate during different phases of a control signal. The keeper circuit may latch the circuit output. The keeper circuit includes a keeper gating device coupled to a keeper device. In one realization, the keeper circuit includes a weak keeper device. The keeper circuit is responsive to a keeper control. The keeper control may be clocked. The keeper control may be self-timed. The keeper device may be sized to sufficiently overcome leakage current in the evaluation circuit. The weak keeper device may be minimally sized to sufficiently overcome noise while the keeper device is effectively disabled.

In one embodiment in accordance with the present invention, the reduction in the effective strength of the keeper circuit occurs before arrival of the fastest signal coupled to a sensitive output path of the evaluation circuit. The effective keeper circuit strength is restored after arrival of the slowest signal coupled to the sensitive output path of the evaluation circuit.

In one embodiment in accordance with the present invention, the dynamic node is precharged high. The evaluation circuit may be n-logic. In one embodiment in accordance with the present invention, the dynamic node is precharged low. The evaluation circuit may be p-logic.

In another embodiment in accordance with the present invention, a method for evaluating a dynamic node is provided. The dynamic node is precharged, a keeper coupled to the dynamic node is effectively disabled during an interval in which at least one path in an evaluation circuit is sensitive to a keeper device, an evaluation circuit is evaluated, and the keeper device is effectively enabled. The dynamic node may be protected from noise during the disabling of the keeper device.

In another embodiment in accordance with the present invention, a method for reducing effective keeper circuit strength during an interval in which at least one path of an evaluation circuit is sensitive to a strong keeper device is provided. A weak keeper device may remain effective during the interval.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates similar or identical items.

DESCRIPTION OF THE PREFERRED EMBODIMENT(S)

Figure 1:
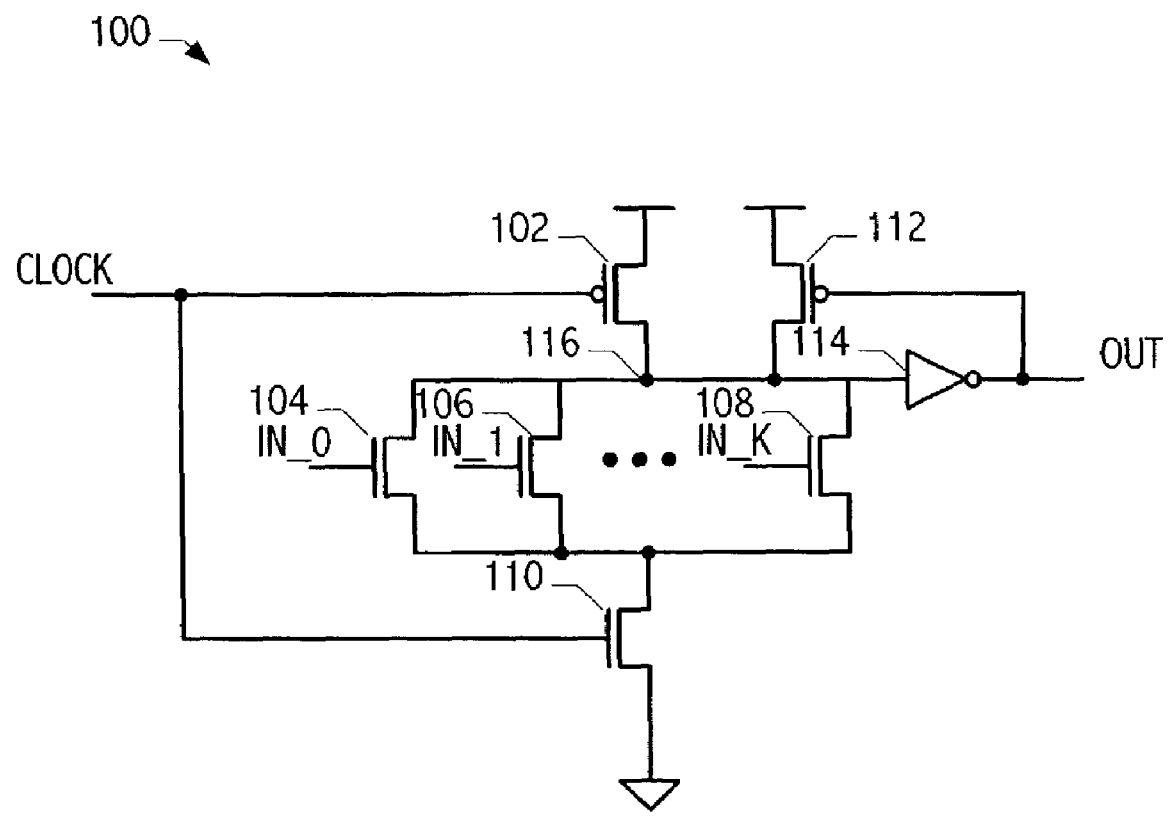
FIG. 1 is a prior art implementation of an OR circuit.
Figure 2:
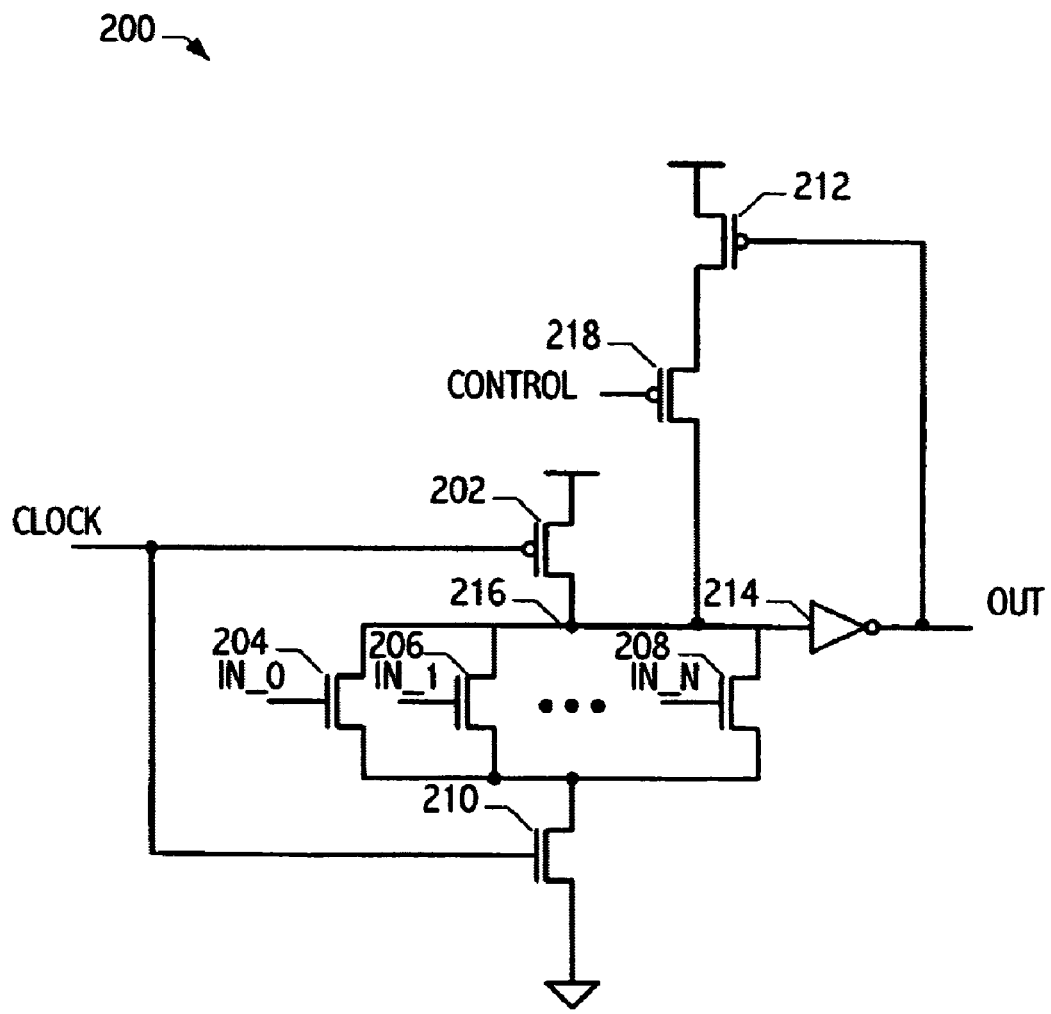
FIG. 2 illustrates an exemplary OR circuit configured consistent with the present invention.

Referring to FIG. 2, circuit 200 includes keeper 212 in series with keeper gating device 218. Keeper 212 is a p-transistor designed to have a gain sufficient to offset the effects of leakage currents in evaluation circuits with a large number of pull-down devices. The size of keeper 212 may be determined by simulating circuit 200 and determining the W/L ratio of keeper 212 necessary to achieve the appropriate gain, or by any other method for sizing circuit devices known in the art. The additional capacitance of keeper 212 may slow down circuit transitions due to additional capacitance introduced by keeper 212. Pull-down devices 204–210 may be unable to overcome keeper 212 during a time interval in which the inputs are expected to switch. To alleviate these detrimental effects on performance, keeper gating device 218 effectively disables keeper 212 during the time interval when the inputs are expected to switch. In most functional cases, inputs IN_0, IN_1, . . . IN_N switch during a known time interval within a clock cycle. Keeper 212 is disabled by keeper gating device 218 upon receipt of a high CONTROL signal at the gate input during a time when inputs IN_0, IN_1, . . . IN_N are expected to switch. Keeper gating device 218 then effectively enables keeper 212 when CONTROL transitions low, after the inputs IN_0, IN_1, . . . IN_N have completed switching.

In general, leakage currents slowly discharge a dynamic node. In circuit 200, the leakage current will not fully discharge dynamic node 216 or change the circuit output value unless keeper 212 is effectively disabled for a long period of time. Therefore, CONTROL is generally optimized to allow enough time for the circuit to evaluate correctly, while not keeping keeper 212 effectively disabled long enough for the leakage currents to change the value of dynamic node 216. The maximum time that keeper 212 can be effectively disabled, without compromising circuit evaluation, may be determined by simulation of the arrival time of inputs IN_0, IN_1, . . . IN_N for the particular circuit in a targeted manufacturing process, effectuating design rules that guarantee arrival times for IN_0, IN_1, . . . IN_N, or any other method for determining arrival times known in the art.

Figure 3:
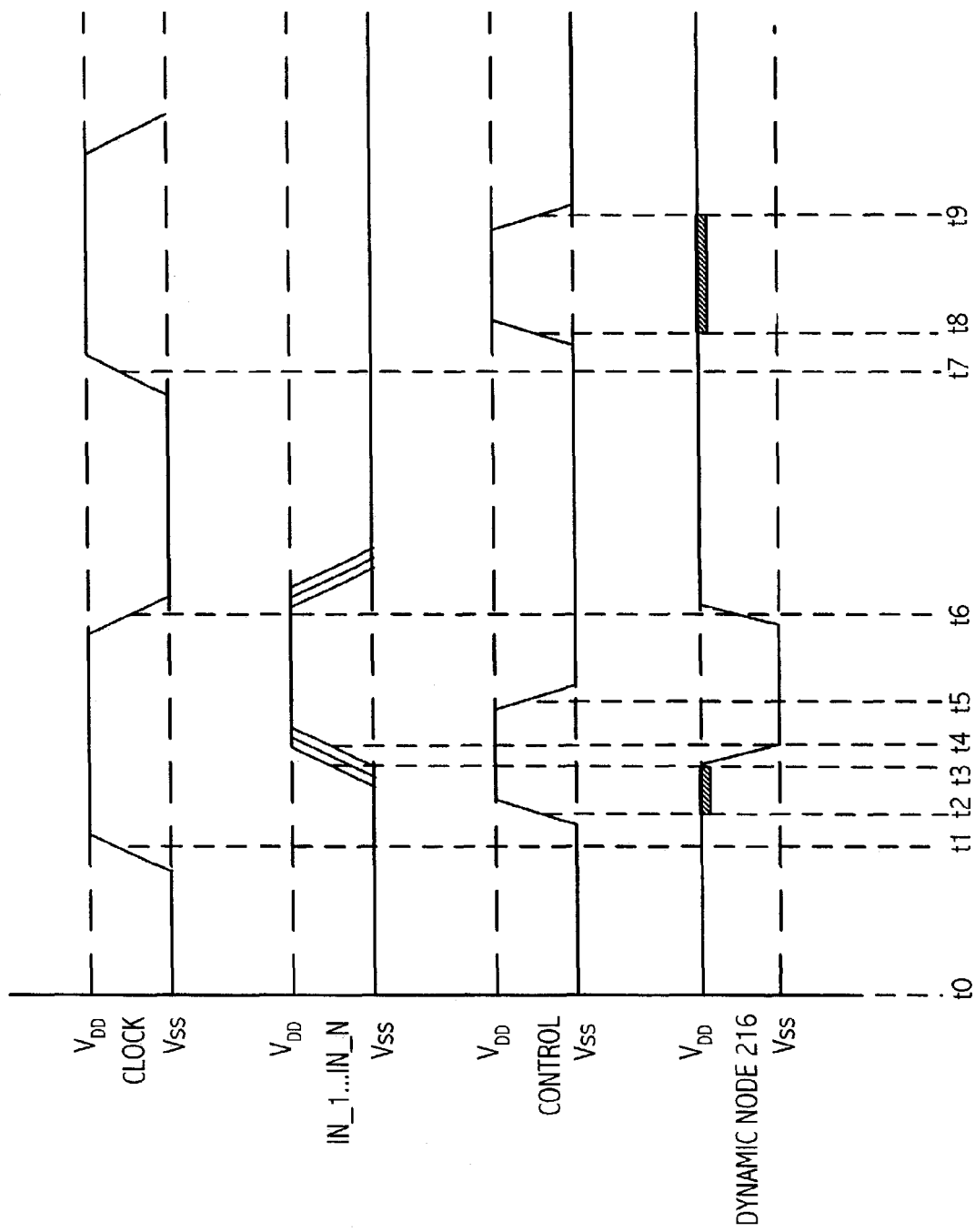
FIG. 3 illustrates a timing diagram consistent with the present invention.

In FIG. 3, timing waveforms for CLOCK, inputs IN_1 . . . IN_N, CONTROL, and dynamic node 216 illustrate the operation of circuit 200. At time t0, CLOCK is low and circuit 200 is in the precharge phase. Device 210 is disabled, device 202 is enabled, and node 216 is precharged high by device 202. Keeper 212 is on because OUT is low. Keeper gating device 218 is enabled because CONTROL is low. Thus, keeper 212 is effectively enabled and maintains the precharge on dynamic node 216. At time t1, CLOCK transitions high and circuit 200 enters the evaluation phase. Device 202 is disabled, device 210 is enabled, dynamic node 216 maintains a high value because keeper 212 remains effectively enabled by the low CONTROL signal.

The inputs, IN_0, IN_1, . . . IN_N do not begin to arrive until time t3. In one embodiment, devices 204–208 have the same size, gain, and sensitivity to keeper 212. These devices are sufficiently sized to overcome the precharge on dynamic node 216, but are not strong enough to overcome keeper 212. Keeper 212 is effectively disabled at t2 when CONTROL transitions high and disables keeper gating device 218. CONTROL transitions high before arrival of the fastest input to devices 204–208 to prevent keeper 212 from fighting a discharge of dynamic node 216 by devices 204–208. Between time t2 and t3, dynamic node 216 floats because the keeper path is effectively disabled and neither a pull-down path to $V_{SS}$ nor the precharge path to $V_{DD}$ is enabled. At time t3, the fastest input arrives and at time t4, the slowest input arrives. After the slowest input arrives at t4, evaluation of dynamic node 216 completes. OUT switches according to the value of dynamic node 216, and configures keeper 212 consistent with the value of dynamic node 216. The effect of keeper 212 influences dynamic node 216 after CONTROL transitions to low at t5 and enables keeper gating device 218. Since, in this example, at least one of the input signals IN_0, IN_2, . . . IN_N is high during the interval between t4 and t6 of the evaluation phase, node 216 is discharged by the enabled transistors of devices 204–208 and OUT transitions high. When OUT transitions high, the gate of keeper 212 is high, keeper 212 is disabled, and dynamic node 216 remains discharged.

Circuit 200 enters the precharge phase again at time t6, after CLOCK transitions low. At time t7, circuit 200 enters the evaluation phase. CONTROL disables keeper 212 at time t8, before the arrival time of the fastest of signals IN_0, IN_1, . . . IN_N. Since all of the inputs are low during this evaluation phase and keeper 212 is disabled, dynamic node 216 floats because a path from dynamic node 216 to either power or ground does not exist. However, since the time between t8 and t9 is sufficiently short to avoid leakage current from discharging dynamic node 216, circuit 200 evaluates properly to a low output value. The low value of OUT turns on keeper 212 and at time t9 when CONTROL turns on keeper gating device 218, keeper 212 is effectively enabled and properly reinforces the charge on dynamic node 216.

Figure 4:
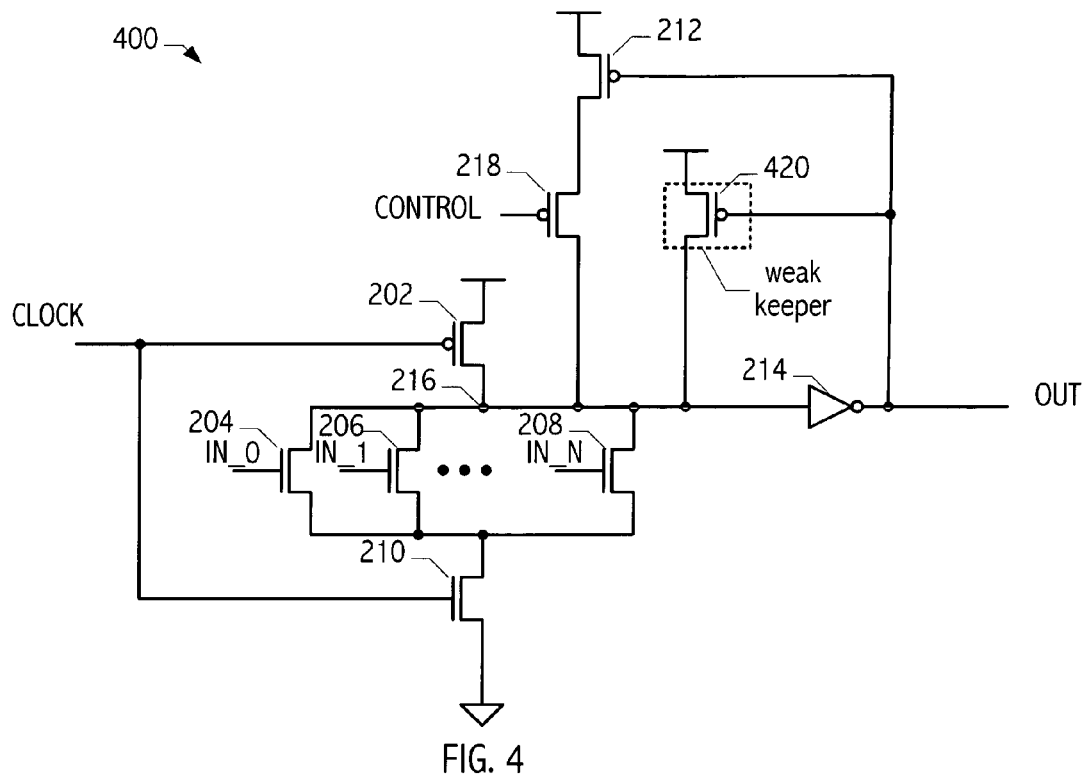
FIG. 4 illustrates another exemplary OR circuit configured consistent with the present invention.

Dynamic node 216 may be susceptible to noise during the period between t8 and t9, where keeper gating device 218 effectively disables keeper 212 and dynamic node 216 is floating. In one embodiment, this noise may be counteracted by reducing the effective keeper strength instead of entirely disabling the keeper function. In some realizations, reduction in keeper strength is accomplished by including a weak keeper in addition to keeper 212 of circuit 200. This enhancement to circuit 200 is illustrated by circuit 400 in FIG. 4. Weak keeper 420 is always effective on dynamic node 216. Weak keeper 420 is a p-transistor that is minimally sized to properly overcome noise, but is not large enough to overcome leakage currents or to substantially impact evaluation or speed. The size of weak keeper 420 may be determined by simulating the circuit and setting the W/L ratio to achieve the appropriate gain, or by any other method for sizing circuit devices known in the art. Although keeper 212 may be larger than prior art keeper devices, the impact of keeper 212 on the circuit performance is minimized by effectively disabling keeper 212 from dynamic node 216 while pull-down devices 204–208 are switching in response to inputs IN_0, IN_1, . . . IN_N.

The period when keeper 212 is disabled may vary depending upon the particular circuit characteristics. In one embodiment, keeper 212 is disabled long enough to allow the arrival of all input signals during the period where keeper 212 is disabled, but not long enough for leakage current to discharge dynamic node 216. CONTROL is designed to effectively disable keeper 212 before the fastest input arrives and to effectively enable keeper 212 after the slowest input arrives. The timing of CONTROL is determined by simulation or any other method for determining signal arrival times and leakage current discharge times.

In one embodiment, a subset of the pull-down devices is strong enough to overcome keeper 212 and keeper 212 is effectively disabled only during the arrival of the inputs to critical paths, i.e., paths including pull-down devices that are not strong enough to overcome keeper 212. CONTROL is designed to effectively disable keeper 212 before the fastest input arrives to a critical path and to effectively enable keeper 212 after the slowest input arrives to a critical path, but before leakage current discharges dynamic node 216.

In one embodiment, CONTROL is a pulse, based on CLOCK, and has a pulse-width corresponding to the period for effectively disabling keeper 212. In one embodiment, CONTROL is a self-timed signal, i.e., based on a delayed node, with a pulse-width corresponding to the period for effectively disabling keeper 212. The pulse circuitry may be implemented by any design technique known in the art.

Figure 5:
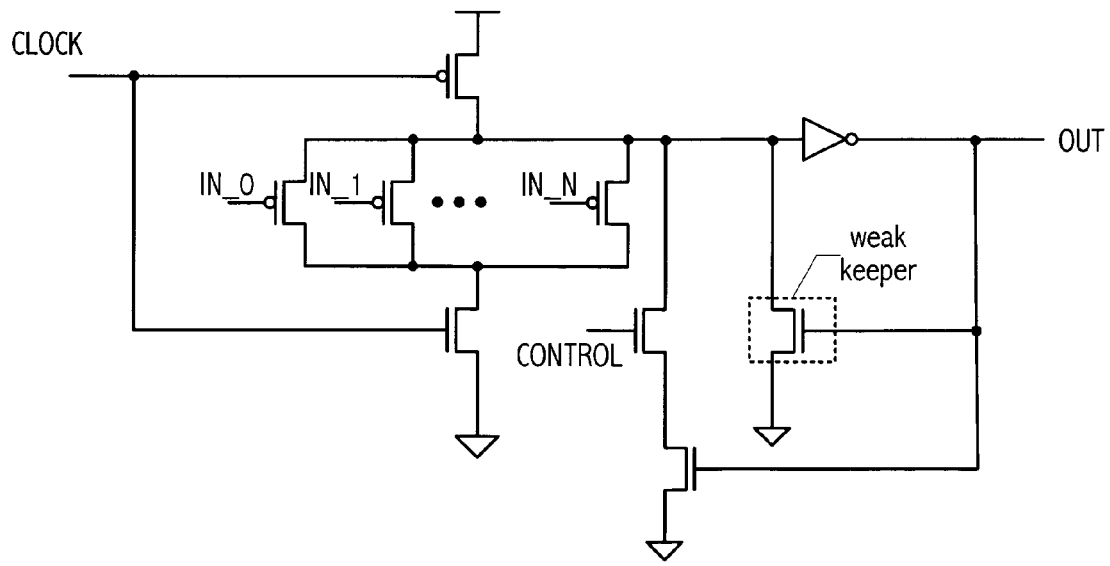
FIG. 5 illustrates another exemplary OR circuit configured consistent with the present invention.

The description of the invention set forth herein is illustrative, and is not intended to limit the scope of the invention as set forth in the following claims. For example, while a specific logic function has been described, the individual functionality may vary. The individual evaluation components are not critical to understanding the invention described herein and typically varies from circuit to circuit. The OR-type circuit of FIG. 2 is for illustration only, and other circuits (such as NOR, NAND, AND, XOR, XNOR, etc.) may also benefit from the techniques described. Although, the evaluation circuitry has been described as including n-channel devices and the keeper devices have been described as p-channel devices, the evaluation circuitry may include p-channel devices and the keeper devices may be n-channel devices (see, e.g. FIG. 5). Moreover, the applications in which the invention may be applied are not limited to dynamic logic circuits, but may extend to other circuits with functions similar to the requirements of dynamic circuits. Other variations and modifications of the embodiments disclosed herein, may be made based on the description set forth herein, without departing from the scope and spirit of the invention as set forth in the following claims.

What is claimed is:

1. A keeper circuit for a dynamic node of a circuit, the keeper circuit comprising at least a weak keeper device, wherein the effective strength of the keeper circuit operating on the dynamic node is reduced from a first non-zero strength level to a second non-zero strength level during an interval in which at least one path in an evaluation circuit is sensitive to a keeper device and wherein the effective strength of the keeper circuit operating on the dynamic node is restored to the first non-zero strength level after arrival of a latest signal transitioning to a level that can discharge the dynamic node.

2. The circuit, as recited in claim 1, wherein the sensitivity of the at least one path includes output of an incorrect value of the evaluation circuit output.

3. The circuit, as recited in claim 1, wherein a response to the sensitivity is otherwise a reduced speed of the evaluation circuit output.

4. A circuit comprising:
a dynamic node;
an evaluation circuit coupled to the dynamic node;
a keeper circuit coupled to the dynamic node, wherein the keeper circuit has a first non-zero strength during a first interval and a second non-zero strength during a second interval, the first non-zero strength being substantially greater than the second non-zero strength; and
wherein the first interval begins before arrival of an earliest signal transitioning to a level that can discharge the dynamic node;
wherein the second interval begins after arrival of a latest signal transitioning to a level that can discharge the dynamic node; and
wherein the keeper circuit includes a weak keeper device coupled to the dynamic node.

5. The circuit, as recited in claim 4, wherein the keeper circuit latches an output of the circuit.

6. The circuit, as recited in claim 4, wherein the keeper circuit includes a first keeper device.

7. The circuit, as recited in claim 6, wherein the keeper circuit includes a keeper gating device coupled to the first keeper device and the dynamic node.

8. The circuit, as recited in claim 4, wherein the keeper circuit is responsive to a keeper control.

9. The circuit, as recited in claim 8, wherein the keeper control is clocked.

10. The circuit, as recited in claim 8, wherein the keeper control is self-timed.

11. The circuit, as recited in claim 4, further comprising:
a clock node;
a precharge device coupled to the clock node and the dynamic node; and
a discharge device coupled to the clock node and the evaluation circuit.

12. The circuit, as recited in claim 11, wherein the precharge device and the evaluation circuit operate during different phases of a control signal.

13. The circuit, as recited in claim 6, wherein the first keeper device is sized to sufficiently overcome the leakage current in the evaluation circuit.

14. The circuit, as recited in claim 4, wherein a reduction in the effective strength of the keeper circuit from the first non-zero strength to the second non-zero strength occurs before arrival of an earliest signal transitioning to a level that can discharge the dynamic node.

15. The circuit, as recited in claim 4, wherein the effective keeper circuit strength is restored to the first non-zero strength from the second non-zero strength after arrival of a latest signal transitioning to a level that can discharge the dynamic node.

16. The circuit, as recited in claim 4, wherein the weak keeper device is minimally sized to sufficiently overcome noise while a first keeper device is effectively disabled.

17. The circuit, as recited in claim 4, wherein the dynamic node is precharged high.

18. The circuit, as recited in claim 17, wherein the evaluation circuit is n-logic.

19. The circuit, as recited in claim 4, wherein the dynamic node is precharged low.

20. The circuit, as recited in claim 19, wherein the evaluation circuit is p-logic.

21. A method for evaluating a dynamic node, comprising:
precharging a dynamic node;
effectively disabling a first keeper device coupled to the dynamic node during an interval in which at least one path in an evaluation circuit is sensitive to a keeper device;
evaluating an evaluation circuit;
protecting the dynamic node from noise during the interval;
effectively enabling the first keeper device after arrival of a latest signal transitioning to a level that can discharge the dynamic node; and wherein the dynamic node is protected by at least a weak keeper device.

22. A method for weakening a keeper circuit, comprising:
reducing effective keeper circuit strength from a first non-zero strength to a second non-zero strength during an interval in which at least one path of an evaluation circuit is sensitive to a keeper device;
restoring the effective keeper circuit strength to the first non-zero strength after arrival of a latest signal transitioning to a level that can discharge an associated dynamic node; and
maintaining a weak keeper device during the interval.

23. An apparatus for evaluating a dynamic node, comprising:
a dynamic node;
a first keeper device coupled to the dynamic node;
means for precharging the dynamic node;
means for effectively disabling the first keeper device coupled to the dynamic node during an interval in which at least one path in an evaluation circuit is sensitive to a keeper device;
means for protecting the dynamic node from noise during the interval;
means for evaluating an evaluation circuit;
means for effectively enabling the first keeper device after arrival of a latest signal transitioning to a level that can discharge the dynamic node; and
wherein the means for protecting the dynamic node comprises at least a weak keeper device.

24. A circuit comprising:
a dynamic node;
a precharge device coupled to the dynamic node;
an evaluation circuit coupled to the dynamic node;
a discharge device coupled to the evaluation circuit;
a clock node coupled to the precharge device and the discharge device;
a keeper circuit coupled to the dynamic node, wherein a first keeper device is selectively disabled during a first interval;
at least a second keeper device, the second keeper device being coupled to the dynamic node;
wherein a gain of the first keeper device is substantially greater than a gain of the second keeper device.

25. The circuit, as recited in claim 24, wherein the evaluation circuit overcomes the second keeper.

26. The circuit, as recited in claim 24, wherein the second keeper has a gain sufficient to overcome noise but insufficient to overcome leakage current in the evaluation circuit.

27. The circuit, as recited in claim 24, further comprising:
a keeper gating device coupling the first keeper device to the dynamic node.

28. The circuit, as recited in claim 24, wherein the first keeper has a gain sufficient to overcome leakage current in the evaluation circuit.

* * * * *